(12) United States Patent
Ashizawa et al.

(10) Patent No.: US 9,331,139 B2
(45) Date of Patent: May 3, 2016

(54) RUTHENIUM FILM FORMATION METHOD AND STORAGE MEDIUM

(71) Applicant: TOKYO ELECTRON LIMITED, Tokyo (JP)

(72) Inventors: Hiroaki Ashizawa, Nirasaki (JP); Takaaki Iwai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 135 days.

(21) Appl. No.: 14/219,141

(22) Filed: Mar. 19, 2014

(65) Prior Publication Data

US 2014/0287585 A1 Sep. 25, 2014

(30) Foreign Application Priority Data

Mar. 21, 2013 (JP) ................. 2013-059021

(51) Int. Cl.
| | | |
|---|---|---|
| *H01L 21/20* | (2006.01) | |
| *H01L 49/02* | (2006.01) | |
| *C23C 16/18* | (2006.01) | |
| *C23C 16/04* | (2006.01) | |
| *C23C 16/455* | (2006.01) | |
| *H01L 21/314* | (2006.01) | |
| *H01L 21/768* | (2006.01) | |
| *H01L 27/108* | (2006.01) | |
| *H01L 21/02* | (2006.01) | |
| *C23C 18/12* | (2006.01) | |

(52) U.S. Cl.
CPC .............. *H01L 28/65* (2013.01); *C23C 16/045* (2013.01); *C23C 16/18* (2013.01); *C23C 16/45553* (2013.01); *C23C 18/1279* (2013.01); *H01L 21/0228* (2013.01); *H01L 21/3141* (2013.01); *H01L 21/76823* (2013.01); *H01L 27/10852* (2013.01); *H01L 28/90* (2013.01)

(58) Field of Classification Search
CPC ... H01L 28/65; H01L 27/10852; H01L 28/91; H01L 28/40; H01L 21/3141; H01L 21/76823; H01L 21/0228; C23C 16/40; C23C 16/45525; C23C 16/18; C23C 16/45553; C23C 18/1279
See application file for complete search history.

(56) References Cited

U.S. PATENT DOCUMENTS

| | | | |
|---|---|---|---|
| 7,049,232 B2 | 5/2006 | Lee et al. | |
| 8,329,569 B2* | 12/2012 | Li | C23C 16/0281 257/750 |
| 2001/0043453 A1* | 11/2001 | Narwankar | H01L 28/75 361/306.3 |
| 2004/0005753 A1* | 1/2004 | Kostamo | C23C 16/40 438/222 |
| 2004/0266175 A1* | 12/2004 | Chen | C23C 14/022 438/629 |
| 2008/0157278 A1* | 7/2008 | Do | H01L 28/65 257/532 |
| 2008/0171436 A1* | 7/2008 | Koh | C23C 16/18 438/681 |
| 2008/0214003 A1* | 9/2008 | Xia | C23C 16/06 438/686 |
| 2009/0104777 A1* | 4/2009 | Kim | C23C 16/40 438/686 |
| 2010/0047988 A1* | 2/2010 | Cho | C23C 16/18 438/381 |
| 2013/0115367 A1* | 5/2013 | Noro | H01L 28/65 427/79 |

FOREIGN PATENT DOCUMENTS

JP     4746141 B1    8/2011

* cited by examiner

*Primary Examiner* — Bac Au
(74) *Attorney, Agent, or Firm* — Nath, Goldberg & Meyer; Jerald L. Meyer

(57) ABSTRACT

A ruthenium film formation method including: forming a ruthenium oxide film on a substrate; and reducing the ruthenium oxide film into a ruthenium film, wherein the reducing the ruthenium oxide film comprises at least supplying a ruthenium compound gas containing hydrogen as a reducing agent.

12 Claims, 15 Drawing Sheets

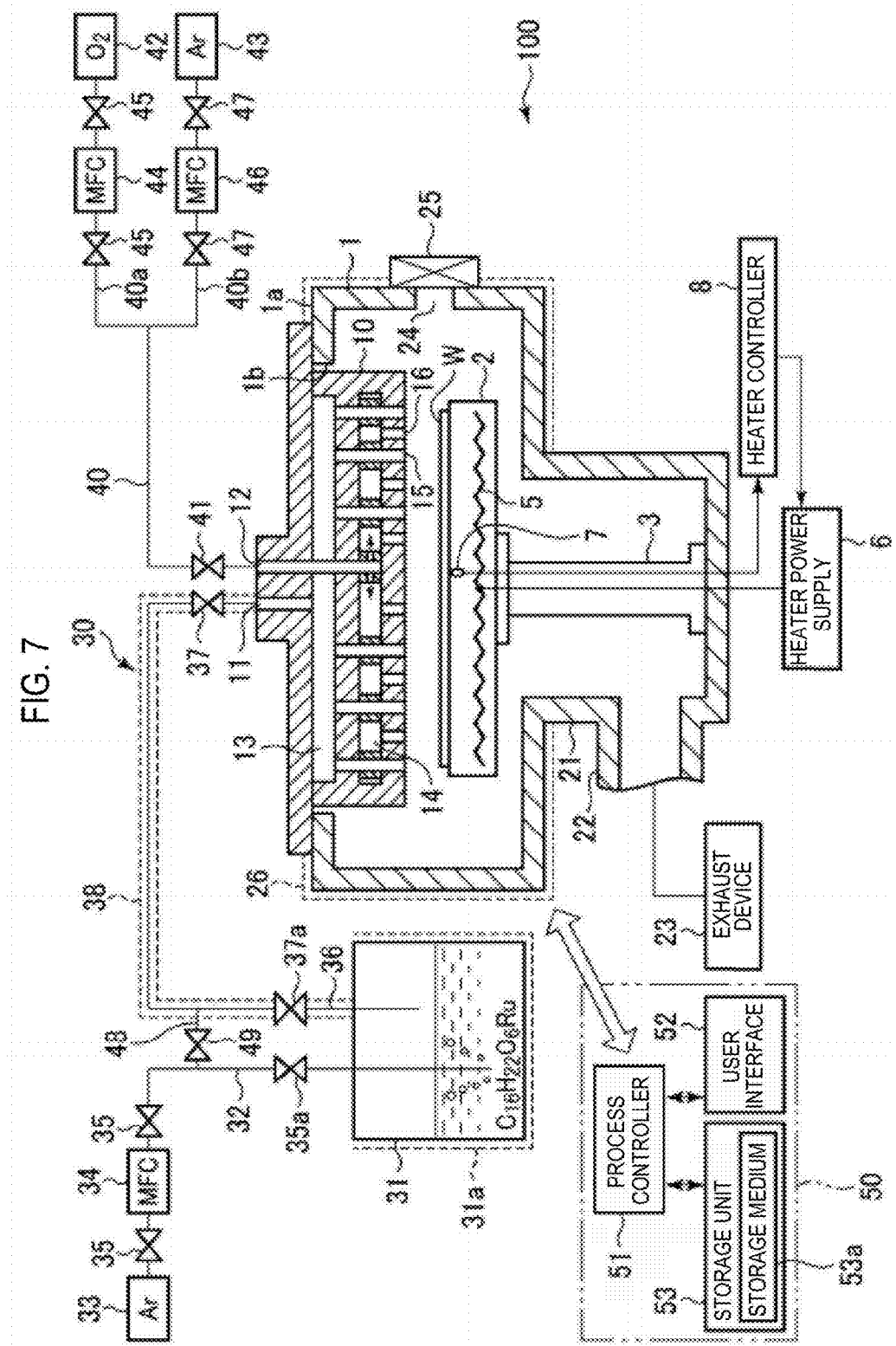

FIG. 11A
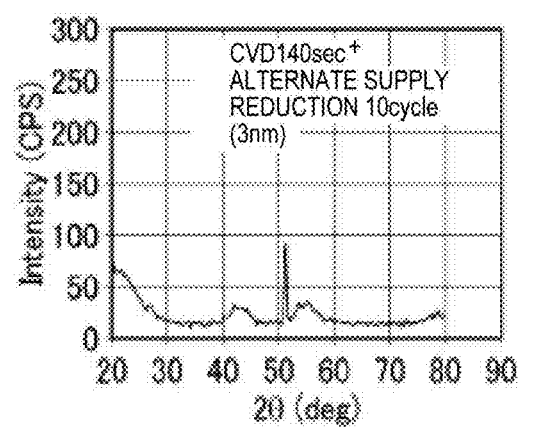
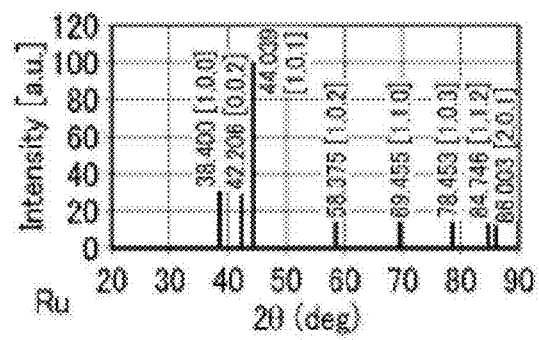

RUTHENIUM FILM FORMATION METHOD AND STORAGE MEDIUM

CROSS-REFERENCE TO RELATED APPLICATION

This application claims the benefit of Japanese Patent Application No. 2013-059021, filed on Mar. 21, 2013, in the Japan Patent Office, the disclosure of which is incorporated herein in its entirety by reference.

TECHNICAL FIELD

The present disclosure relates to a ruthenium film formation method for forming a ruthenium film and a storage medium.

BACKGROUND

In a semiconductor device, an integrated circuit is becoming highly integrated. In a DRAM, it is required that the area of a memory cell is made small and the storage capacity is made large. To comply with this requirement, a capacitor having a structure of MIM (metal-insulator-metal) is getting a lot of attention. In the capacitor of the MIM structure, a material having a high dielectric constant such as tantalum oxide ($Ta_2O_5$), strontium titanate (SrTiO) or the like is used as an insulation film (dielectric film).

Where an oxide-based material having a high dielectric constant is used as a dielectric film, a necessary dielectric constant is obtained by performing a post-treatment such as a heat treatment or a UV treatment. At this time, the post-treatment is usually performed in an oxygen-existing atmosphere in order to prevent oxygen from escaping from the oxide material. Thus, attention is paid to ruthenium which is more difficult to oxidize than polysilicon which is conventionally used as an electrode material.

In the meantime, the shape of a capacitor is formed into a cylindrical or laminated electrode structure in order to increase the storage capacity of a DRAM. In this structure, it is necessary to form an electrode in a state in which a large step is formed. For that reason, a good step coverage property (step covering property) is required in forming a film. Thus, a CVD (Chemical Vapor deposition) method, which is essentially high in step coverage, is used as an electrode formation method. Furthermore, an ALD (Atomic Layer Deposition) method, which is one type of CVD method, in which a precursor and a reducing gas are supplied alternately, is taken into account.

As a technology of forming a ruthenium film with a CVD method, there is known a technology in which a ruthenium film is formed by adding an oxygen gas to a ruthenium compound having a structure in which two β-diketones and two groups selected from olefin, amine, nitrile and carbonyl are coordinated in Ru and consequently decomposing the raw materials on a heated substrate.

However, it is hard to obtain sufficient step coverage using the aforementioned technology. If an ALD method is used, it is possible to improve the step coverage. However, the throughput becomes extremely low.

SUMMARY

Some embodiments of the present disclosure provide a ruthenium film formation method capable of forming a ruthenium film with high step coverage without reducing throughput and provide a storage medium that stores a program for performing the ruthenium film formation method. The present inventors have repeatedly studied in order to solve the aforementioned problems and have conceived that a ruthenium oxide film can be formed with high step coverage and high throughput and further that, if the ruthenium oxide film is reduced, a ruthenium film can be formed with high step coverage and high throughput. Furthermore, the present inventors have found that, if hydrogen or the like as an ordinary reducing agent is used in reducing ruthenium oxide, it is difficult to maintain the form of a film due to a change in volume and further found that, if a ruthenium compound containing hydrogen is used as a reducing agent, it is possible to obtain a robust ruthenium film. The present disclosure is completed based on these findings.

According to one embodiment, a ruthenium film formation method includes forming a ruthenium oxide film on a substrate; and reducing the ruthenium oxide film into a ruthenium film, wherein the reducing the ruthenium oxide film comprises at least supplying a ruthenium compound gas containing hydrogen as a reducing agent.

According to another embodiment, a ruthenium film formation method includes forming a ruthenium oxide film on a substrate; and reducing the ruthenium oxide film into a ruthenium film, wherein the forming the ruthenium oxide film comprises forming the ruthenium oxide film on the substrate by supplying a ruthenium compound having a structure of the following chemical formula (1) in which two β-diketones and two groups selected from olefin, amine, nitrile and carbonyl are coordinated in Ru, to the substrate in a vapor phase state, supplying an oxygen gas to the substrate and allowing the ruthenium compound and the oxygen gas to react with each other:

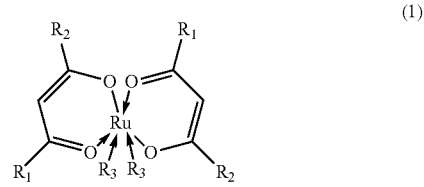

(1)

where R1 and R2 are alkyl groups whose total carbon number is 2 to 5 and R3 is a group selected from an olefin group, an amine group, a nitrile group and a carbonyl group, the ruthenium compound having the structure of the foregoing chemical formula (1) being used as the reducing agent in the reducing the ruthenium oxide film.

According to another embodiment, a non-transitory storage medium operated on a computer and configured to store a program for controlling a processing apparatus, wherein the program, when executed, causes the computer to control the processing apparatus so as to perform the aforementioned ruthenium film formation method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a schematic diagram showing one example of a processing apparatus for performing a preferred embodiment of the present disclosure.

FIGS. 11A to 11C are graphs showing the X-ray diffraction spectra of films obtained after performing 10 cycles of alternate supply reduction with respect to a $RuO_2$ film formed in a CVD method by changing the processing time to 140 sec, 280 sec and 560 sec.

DETAILED DESCRIPTION

An embodiment of the present disclosure will now be described in detail with reference to the accompanying drawings.

In this specification, although mL/min is used as a unit for flow rate, since the volume of gas changes greatly according to a temperature and an atmospheric pressure, the value of the flow rate calculated under normal conditions is used. In addition, since flow rate under normal conditions is generally expressed with a unit of sccm (Standard Cubic Centimeter per Minutes), the unit of sccm is added to the value of flow rate. Normal conditions as used herein is a state of STP (standard temperature and pressure) where the temperature is 0 degrees C., and atmospheric pressure is 1 atm (101325 Pa).

Ruthenium Film Formation Method as a Whole

Figure 1:
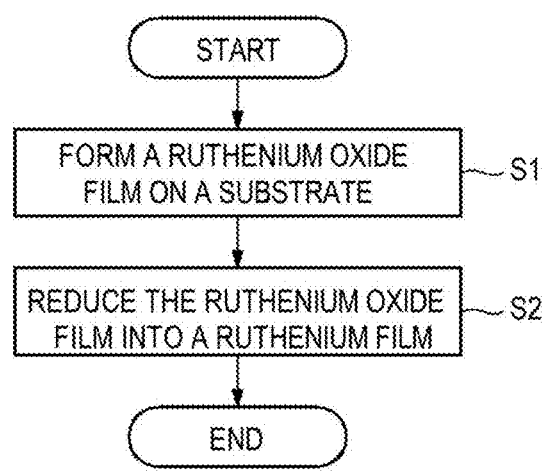
FIG. 1 is a flowchart showing steps of a ruthenium film formation method according to the present disclosure.

FIG. 1 is a flowchart showing steps of a ruthenium film formation method according to the present disclosure.

As shown in FIG. 1, in the present disclosure, a ruthenium oxide film is first formed on a substrate (step S1) and then the ruthenium oxide film is reduced into a ruthenium film (step S2). Ruthenium oxide is not necessarily made of $RuO_2$ in its entirety but is mainly composed of $RuO_2$. In the following description, ruthenium oxide will be often referred to as $RuO_2$.

Figure 2:
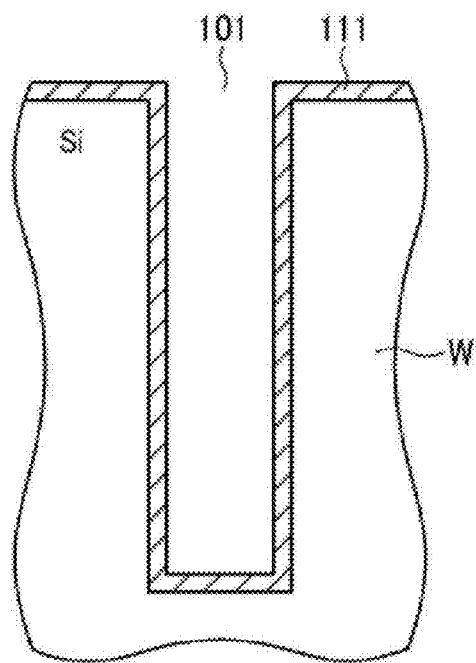
FIG. 2 is a sectional view for illustrating an example in which the present disclosure is applied to a lower electrode of a DRAM capacitor.
Figure 3:
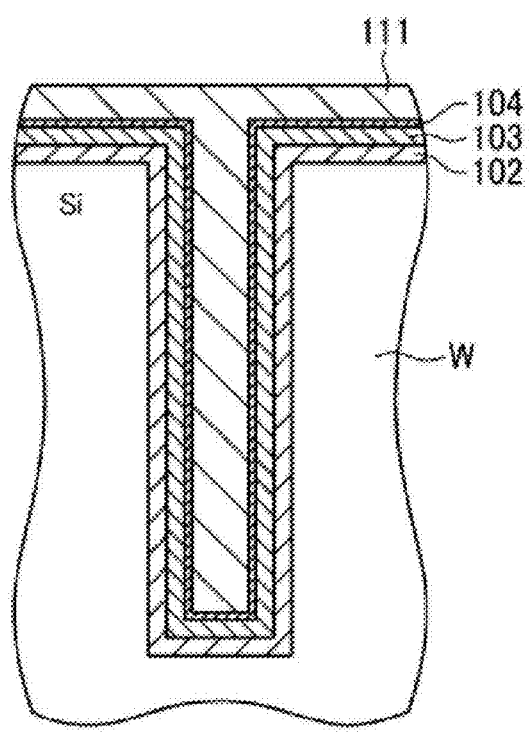
FIG. 3 is a sectional view for illustrating an example in which the present disclosure is applied to an upper electrode of the DRAM capacitor.

A semiconductor substrate (semiconductor wafer) is illustrated as a typical example of the substrate which is not limited thereto. It may also be possible to use a FPD (flat panel display) substrate represented by a LCD (liquid crystal display) panel, or a ceramic substrate. If a ruthenium film is used as a lower electrode of a DRAM capacitor, as shown in FIG. 2, a semiconductor wafer (silicon wafer) W having a trench 101 is used as the substrate. A ruthenium oxide ($RuO_2$) film 111 for the formation of the lower electrode is formed within the trench 101. If a ruthenium film is used as an upper electrode of a DRAM capacitor, as shown in FIG. 3, a semiconductor wafer (silicon wafer) W in which a lower electrode 102 and a dielectric film 103 made of, e.g., SrTiO, are formed within a trench 101 thereof and in which a barrier film 104 made of, e.g., a TiN film, is formed on the dielectric film 103, is used as the substrate. A ruthenium oxide ($RuO_2$) film 111 for the formation of the upper electrode is formed on the barrier film 104.

Figure 4:
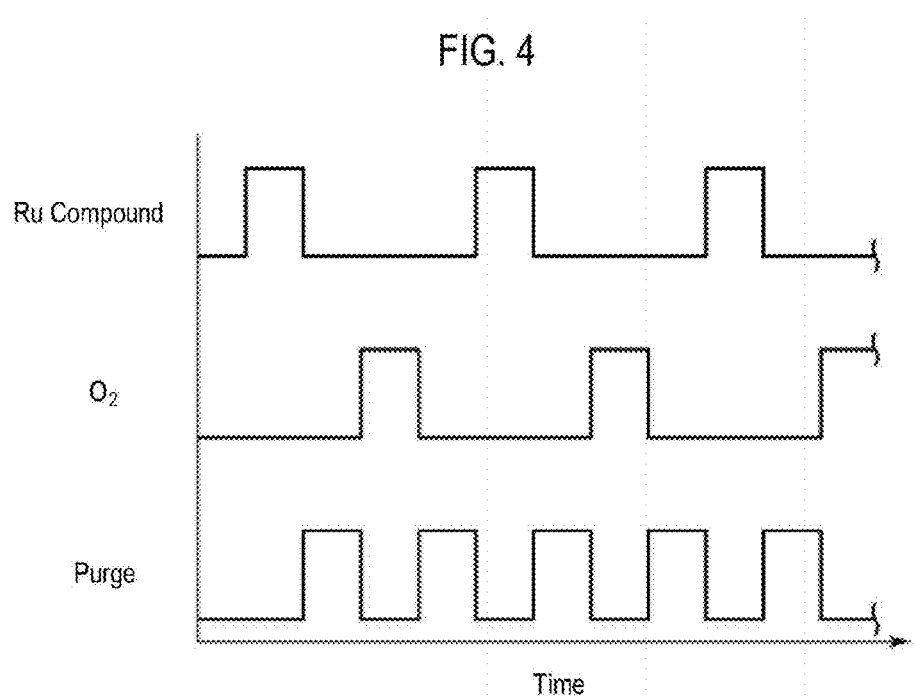
FIG. 4 is a timing chart showing a film formation sequence when forming a ruthenium oxide film by an ALD method.

The method of forming the ruthenium oxide ($RuO_2$) film in step S1 may be any method may be a CVD method. If the ruthenium oxide film is formed by a CVD method, a ruthenium compound gas and a gas for the reduction of a ruthenium compound, e.g., an oxygen gas ($O_2$ gas), are simultaneously supplied into a chamber within which the substrate is disposed, thereby forming a ruthenium oxide ($RuO_2$) film having a predetermined thickness. The CVD method includes an ALD method by which a film is formed by alternately supplying a ruthenium compound gas and a gas for the reduction of a ruthenium compound. If a ruthenium oxide film is formed by the ALD method, as shown in FIG. 4, a ruthenium compound gas and an oxygen gas ($O_2$ gas) are alternately supplied with purge performed therebetween. The purge operation is performed by introducing a purge gas while evacuating the interior of the chamber. An inert gas such as Ar, $N_2$ or the like can be used as the purge gas. If a ruthenium oxide ($RuO_2$) film is formed by a CVD method (including an ALD method), the processing temperature may be in a range of 200 to 350 degrees C. By using the ALD method, it is possible to form a low-impurity film at a lower temperature.

The Ru compound is not particularly limited. It is possible to use different kinds of conventionally available Ru compounds, e.g., $Ru(CP)_2$, $Ru(C_5H_5)_2$, $Ru(EtCp)_2$ and $Ru(C_5H_4-C_2H_5)_2$. In some embodiments, a ruthenium compound is used having a structure having the following chemical formula (1) in which two β-diketones and two groups selected from olefin, amine, nitrile and carbonyl are coordinated in Ru:

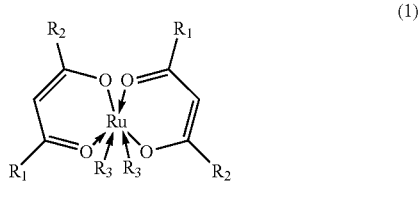

where $R_1$ and $R_2$ are alkyl groups whose total carbon number is 2 to 5 and $R_3$ is a group selected from an olefin group, an amine group, a nitrile group and a carbonyl group.

The ruthenium compound having the structure of the foregoing chemical formula (1) is used as a film formation raw material. An $O_2$ gas is used as a reducing gas. A ruthenium oxide ($RuO_2$) film is formed by a CVD method (including an ALD method) while controlling the amounts of the ruthenium compound and the $O_2$ gas. This makes it possible to form a film within a short period of incubation time and at a high film formation rate. Moreover, it is possible to accomplish good step coverage by which a film can be formed in a recess portion having a high aspect ratio of 50 or more. This is attributed to the fact that, in the ruthenium compound having the structure of the foregoing chemical formula (1), the group (ligand) such as olefin, amine, nitrile and carbonyl coordinated in Ru hardly hinders adsorption of Ru to the wafer W and is relatively easily desorbed, and thus, Ru is easily adsorbed to the wafer W. This makes it possible to shorten the incubation time. Since Ru is easily adsorbed to the substrate as mentioned above, it is possible to obtain better step coverage which enables film formation even in a recess portion having a very high aspect ratio of 50 or more. In addition, the remaining β-diketone (diketonate ligand) is easily decomposed by an oxygen gas ($O_2$ gas), which makes it possible to rapidly form a ruthenium oxide ($RuO_2$) film on the wafer W. It is therefore possible to obtain a high film formation rate.

In the ruthenium compound having the structure of the foregoing chemical formula (1), examples of the β-diketone include any one of 2,4-hexanedione, 5-methyl-2,4-hexanedione, 2,4-heptanedione, 5-methyl-2,4-heptanedione, 6-methyl-2,4-heptanedione and 2,4-octanedione.

In the ruthenium compound having the structure of the foregoing chemical formula (1), $R_3$ that is carbonyl having a structure of the following chemical formula (2) may be used:

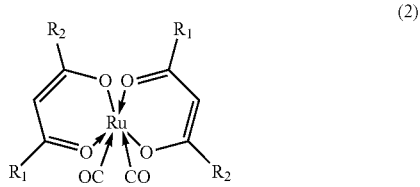

Other examples of the ruthenium compound include a compound having a composition formula of $C_{16}H_{22}O_6Ru$ and having a structure of the following chemical formula (3):

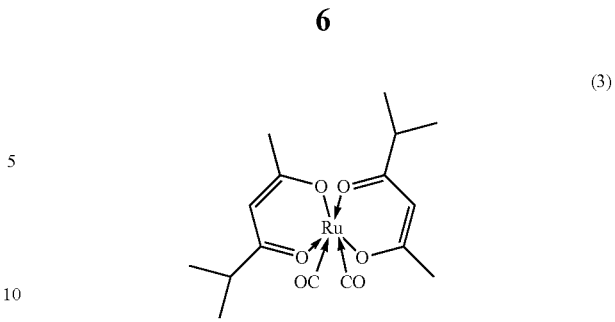

In the case of using a compound having the structure of the foregoing chemical formula (3), it is considered that, in terms of stoichiometry, a ruthenium oxide ($RuO_2$) film is formed by the following reaction:

$$2C_{16}H_{22}O_6Ru + 39O_2 \rightarrow 2RuO_2 + 22H_2O\uparrow + 32CO_2\uparrow$$

In the ruthenium compound having the structure of the foregoing chemical formula (3), three kinds of isomers exist that differ in the positions of a methyl group and a propyl group of two β-diketones. The content by percentage of the isomers is arbitrary.

In the ruthenium compound having the structure of the foregoing chemical formula (1), $R_3$ is carbonyl (CO) having the structure of the chemical formula (2). Carbonyl having a small molecular weight does not disturb adsorption of the ruthenium compound to the wafer W and tends to be very easily desorbed in the group of $R_3$. Therefore, the adsorptivity of the ruthenium compound is very high. This makes it possible to more effectively provide the effect of shortening the incubation time and the effect of increasing the step coverage.

U.S. Pat. No. 7,049,232 discloses that a ruthenium film is formed by a CVD method using the ruthenium compound of the foregoing chemical formula (1) and the oxygen gas ($O_2$ gas). In case of using the compound of the foregoing chemical formula (3) having a composition formula of $C_{16}H_{22}O_6Ru$ as the ruthenium compound, it is considered that ruthenium (Ru) is formed by the following reaction formula:

$$2C_{16}H_{22}O_6Ru + 37O_2 \rightarrow 2Ru + 22H_2O\uparrow + 32CO_2\uparrow$$

This reaction formula differs from the formation reaction of the ruthenium oxide ($RuO_2$) only in terms of the amount of oxygen supplied. That is, if strong oxidization is performed using the ruthenium compound of the foregoing chemical formula (3), ruthenium oxide is formed. If weak oxidization is performed, ruthenium is formed. Therefore, in order to form a ruthenium film using the ruthenium compound, it is necessary to reduce the flow rate (partial pressure) of the oxygen gas or to reduce the film formation pressure. For that reason, the step coverage and the film formation rate must be decreased. In contrast, in case of forming a ruthenium oxide, there is no such restriction, and therefore it is possible to increase the step coverage, the film formation rate and the throughput.

The process of step S2 for reducing the ruthenium oxide film includes at least supplying a ruthenium compound gas containing hydrogen as a reducing agent.

If only a chemical reaction is taken into account, the ruthenium oxide ($RuO_2$) is readily reduced into ruthenium by a hydrogen gas. At this time, the reaction formula is as follows:

$$RuO_2 + 2H_2 \rightarrow Ru + 2H_2O$$

However, the density of a ruthenium oxide ($RuO_2$) film is 6.97 g/cm$^3$ whereas the density of a ruthenium (Ru) film is 12.45 g/cm$^3$. Therefore, in case of reducing the ruthenium oxide ($RuO_2$) film with a hydrogen gas, the ruthenium oxide ($RuO_2$) film undergoes a sharp decrease in volume. Thus, the ruthenium oxide ($RuO_2$) film is converted to a ruthenium film which is low in continuity or powdery ruthenium. The same applies to the case where ammonia is used as a reducing agent.

In order to reduce the ruthenium oxide ($RuO_2$) film while relieving the change in volume, a ruthenium compound gas containing hydrogen as a reducing agent is used. The hydrogen contained in the structure of the hydrogen-containing ruthenium compound reduces ruthenium oxide ($RuO_2$) and the ruthenium in the structure supplements the film. This makes it possible to alleviate the decrease in film volume caused by the reduction. As a result, it is possible to obtain a robust ruthenium film. Accordingly, by reducing, e.g., the ruthenium oxide ($RuO_2$) film 111 shown in FIGS. 2 and 3 in this manner, it is possible to form a lower electrode or an upper electrode of a DRAM capacitor composed of a ruthenium (Ru) film.

While the hydrogen-containing ruthenium compound is not particularly limited, the ruthenium compound may be used when forming a ruthenium oxide by a CVD method in step S1 mentioned above. The process can be simplified by using the same ruthenium compound in steps S1 and S2. According to one embodiment, the ruthenium compound of the foregoing chemical formula (1) in steps S1 and S2 is used. Steps S1 and S2 may be performed either in situ or ex situ. In case of an in-situ process, steps S1 and S2 may be performed within the same chamber or in different chambers using a multi-chamber apparatus provided with a vacuum transfer room.

According to one embodiment, the processing temperature in step S2 is may be in a range of 200 to 350 degrees C. In case of performing step S1 by a CVD method (including an ALD method) and then performing step S2 within the same chamber, steps S1 and S2 may be performed at the same temperature.

Figure 5A:
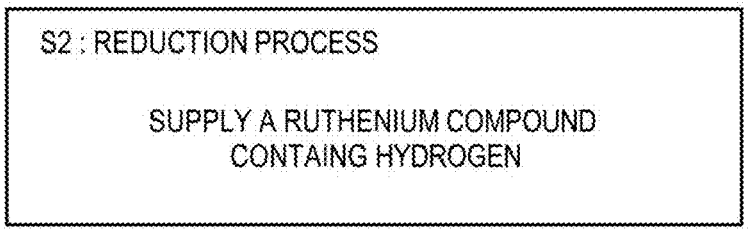
FIGS. 5A to 5C are flowcharts for explaining specific examples of a process for reducing the ruthenium oxide film into a ruthenium film in step S2.
Figure 5B:
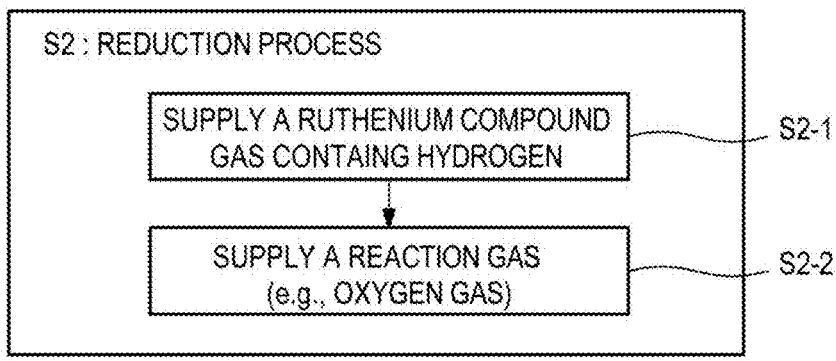
Figure 5C:
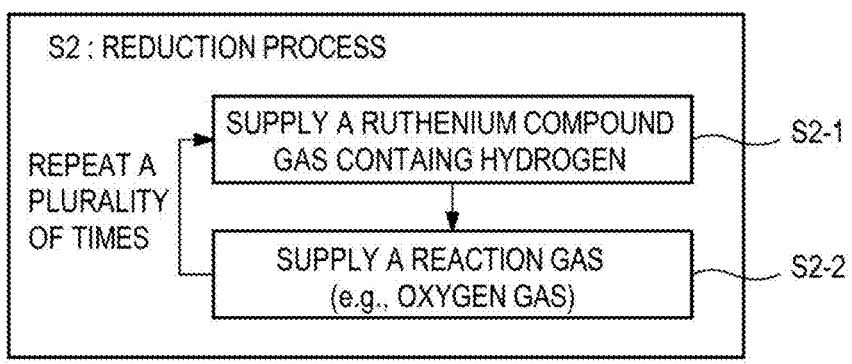

As shown in FIG. 5A, the process for reducing the ruthenium oxide film in step S2 may be performed by merely supplying a hydrogen-containing ruthenium compound. In this case, even if the supply time is increased, the specific resistance of the film is saturated at certain time to a high value in a ruthenium film. This is attributed to the fact that the crystallinity of the ruthenium film is not sufficient. In order to increase the crystallinity of the ruthenium film and to reduce the specific resistance of the film, as shown in FIG. 5B, it is effective to initially supply a hydrogen-containing ruthenium compound gas (step S2-1) and then to supply a reaction gas for decomposing the hydrogen-containing ruthenium compound, e.g., a oxygen gas, with the purge of the interior of the chamber performed between the initial supply of the hydrogen-containing ruthenium compound gas and the supply of the oxygen gas (step S2-2). Thus, the hydrogen-containing ruthenium compound is decomposed. This makes it possible to reduce the impurity existing in the film and to increase the crystallinity of the film. According to one embodiment, as shown in FIG. 5C, steps S2-1 and S2-2 are alternately repeated a plurality of times (cycles) with the purge of the interior of the chamber performed therebetween. In the case of using the ruthenium compound having the structure of the foregoing chemical formula (1), according to one embodiment, the number of repetition times (cycles) is 2 to 500. In case of using the technique shown in FIG. 5C, according to one embodiment, the supply time is increased when initially supplying the hydrogen-containing ruthenium compound gas, thereby sufficiently reducing the film. Thereafter, the supply time of the hydrogen-containing ruthenium compound gas may be shortened.

Figure 6:
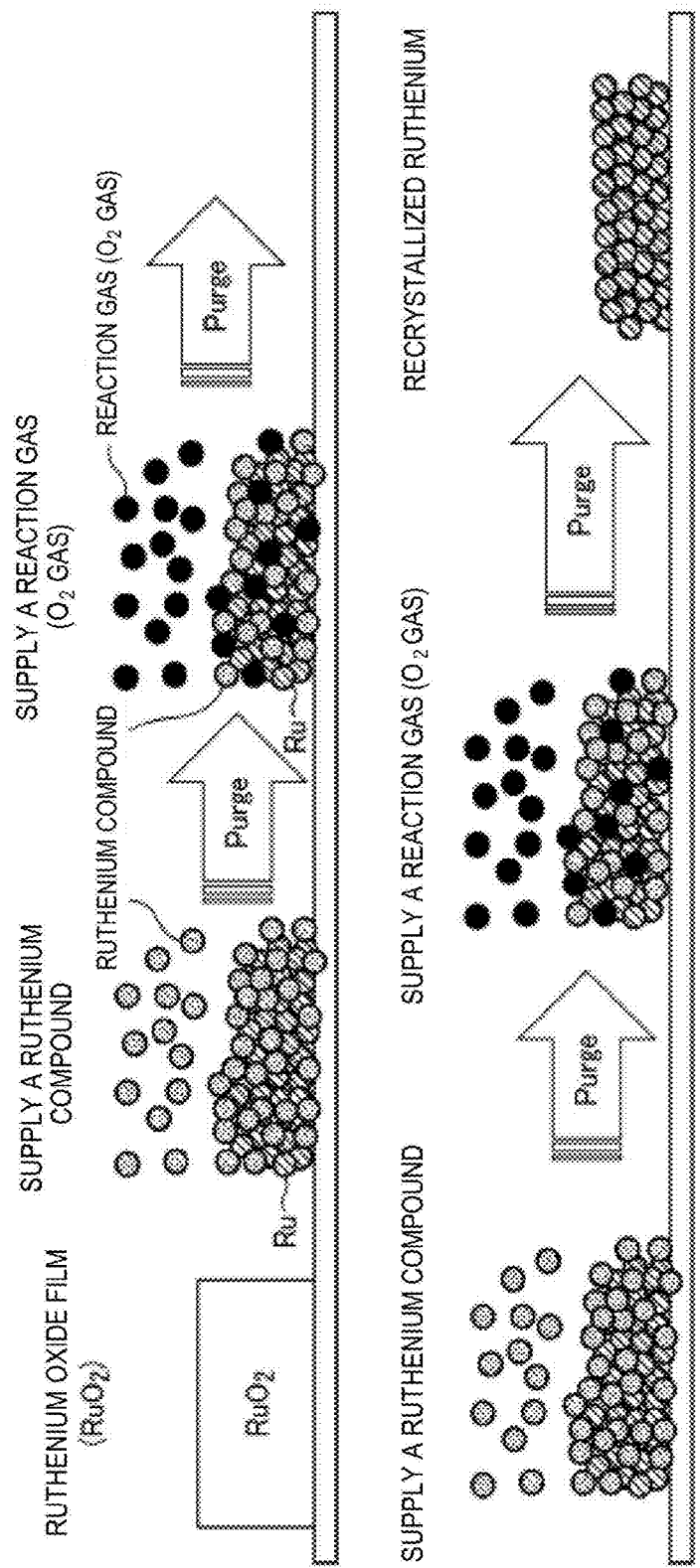
FIG. 6 is a view showing a model of a reduction process in case of using the technique shown in FIG. 5C.
Figure 8A:
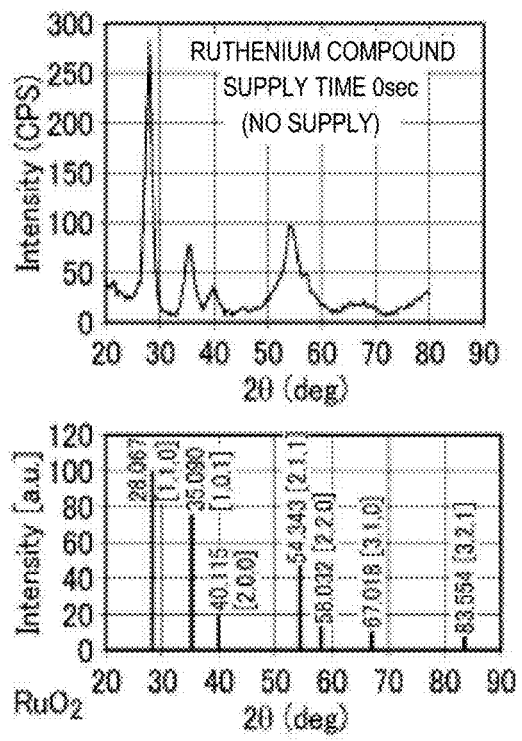
FIGS. 8A to 8D are graphs showing the X-ray diffraction spectra of films when the time for supplying a hydrogen-containing ruthenium compound to a $RuO_2$ formed by a CVD method is changed to 0 sec, 60 sec, 120 sec and 300 sec.
Figure 8B:
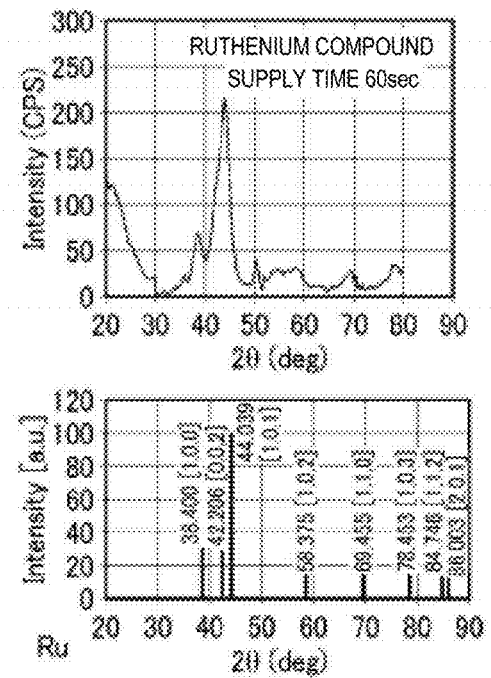
Figure 8C:
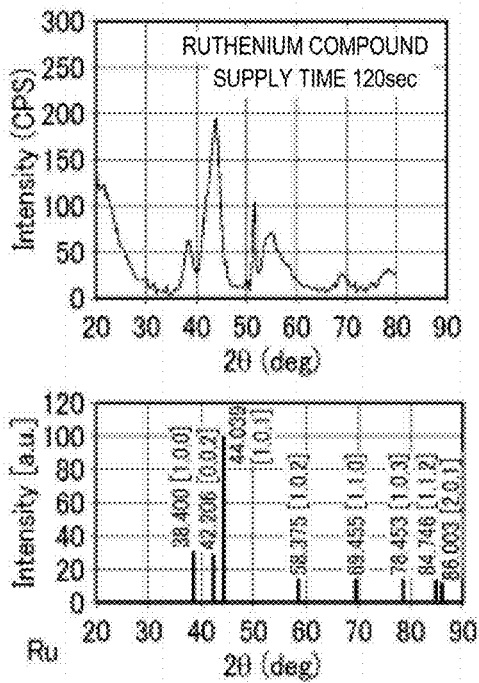
Figure 8D:
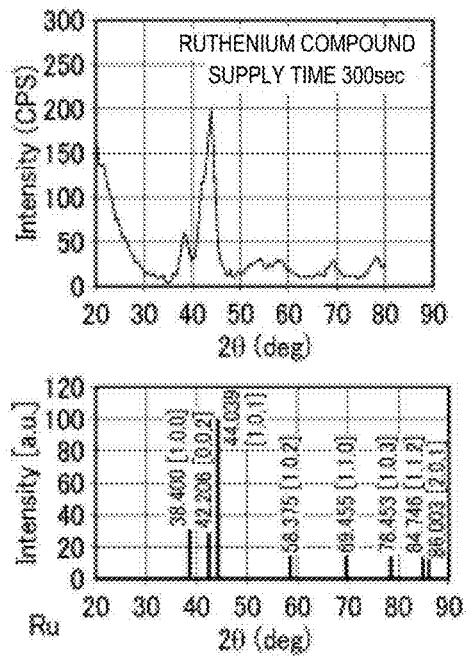

By repeating steps S2-1 and S2-2 as shown in FIG. 5C, it is possible to obtain a ruthenium film superior in crystallinity through the use of a relatively thick ruthenium oxide film. A model of a reduction process used at this time is shown in FIG. 6. In FIG. 6, for the sake of convenience, steps S2-1 and S2-2 are alternately performed twice (namely, a case where the number of repetition times (cycles) is two). In step S2-1, when performed for the first time, a ruthenium compound gas is supplied for a long period of time, whereby a ruthenium oxide ($RuO_2$) film is reduced into a ruthenium (Ru) film. Subsequently, in step S2-2 performed after the purge of the interior of the chamber, an oxygen ($O_2$) gas as a reaction gas is supplied, whereby the ruthenium compound gas adsorbed to the surfaces and interiors of crystals is converted to a ruthenium (Ru) film. The reduced ruthenium (Ru) film is low in crystallinity and continuity. For that reason, in step S2-1, when performed for the second time, a ruthenium compound gas is supplied for a long period of time so that the ruthenium compound gas can arrive at and adsorb to the surface and interior of the film which is low in crystallinity and poor in continuity. Subsequently, in step S2-2 performed after the purge of the interior of the chamber, an oxygen ($O_2$) gas as a reaction gas is supplied, whereby the ruthenium compound gas adsorbed to the surfaces and interiors of crystals is converted to a ruthenium (Ru) film. A ruthenium (Ru) film high in crystallinity is produced by repeating the aforementioned processes. While there is illustrated an example in which an oxygen gas is used as a reaction gas, in one embodiment, it may be possible to use a hydrogen gas.

As described above, since the ruthenium oxide film can be formed with high step coverage and at a high formation rate, by reducing the ruthenium oxide film, it is possible to obtain a ruthenium film with high step coverage and high throughput.

Preferred Embodiment

Next, another embodiment of the present disclosure will be described in detail. FIG. 7 is a schematic diagram showing one example of a processing apparatus for performing an embodiment of the present disclosure.

The processing apparatus 100 includes a hermetically-sealed chamber 1 having a substantially cylindrical shape. A susceptor 2 for horizontally supporting a semiconductor wafer W (hereinafter just referred to as a wafer) as a processed substrate is disposed within the chamber 1 in a state that the susceptor 2 is supported by a cylindrical support member 3 extending from a bottom portion of a below-mentioned exhaust room to a central lower portion of the susceptor 2. The susceptor 2 is made of ceramic such as AlN or the like. A heater 5 is embedded in the susceptor 2. A heater power supply 6 is coupled to the heater 5. A thermocouple 7 is installed near the upper surface of the susceptor 2. The thermocouple 7 is configured to transmit a signal to a heater controller 8. Responsive to the signal transmitted from the thermocouple 7, the heater controller 8 sends a command to the heater power supply 6, thereby controlling a heating operation of the heater 5 so that the wafer W can be controlled to a predetermined temperature. Three wafer lift pins (not shown) are installed in the susceptor 2 so as to protrude and retract with respect to the surface of the susceptor 2. When transferring the wafer W, the wafer lift pins protrude from the surface of the susceptor 2.

A circular hole 1b is formed in a ceiling wall 1a of the chamber 1. A shower head 10 is fitted to the circular hole 1b so as to protrude from the circular hole 1b into the chamber 1. The shower head 10 is designed to inject a gas supplied from a below-mentioned gas supply mechanism 30 into the chamber 1. The shower head 10 includes a first introduction path 11 arranged in the upper portion thereof so as to introduce a source gas therethrough and a second introduction path 12 through which a dilution gas (e.g., an Ar gas) and an oxygen gas ($O_2$ gas) as reducing gases (decomposing gases) are introduced into the chamber 1.

Upper and lower spaces 13 and 14 are defined at two stages within the shower head 10. The first introduction path 11 is coupled to the upper space 13. A first gas injection path 15 extends from the upper space 13 to the bottom surface of the shower head 10. The second introduction path 12 is coupled to the lower space 14. A second gas injection path 16 extends from the lower space 14 to the bottom surface of the shower head 10. That is, the shower head 10 is configured such that a film formation source gas and an oxygen gas are independently injected from the gas injection paths 15 and 16.

An exhaust room 21 protruding downward is installed in the bottom wall of the chamber 1. An exhaust pipe 22 is coupled to the side surface of the exhaust room 21. An exhaust device 23 including a vacuum pump, a pressure control valve and so forth is coupled to the exhaust pipe 22. By operating the exhaust device 23, namely by controlling the opening degree of a pressure control valve (not shown), it is possible to keep the interior of the chamber in a predetermined decompressed state.

A carry-in/carry-out gate 24 for carrying in and carrying out the wafer W therethrough and a gate valve 25 for opening and closing the carry-in/carry-out gate 24 are installed in the sidewall of the chamber 1. A heater 26 is installed in the wall portion of the chamber 1 so that the temperature of the inner wall of the chamber 1 can be controlled when performing a process.

A gas supply mechanism 30 includes a raw material tank 31 that retains a ruthenium compound having the structure of the foregoing chemical formula (1) in which two β-diketones and two groups selected from olefin, amine, nitrile and carbonyl are coordinated in Ru. A heater 31a is installed around the raw material tank 31 so as to heat the raw material retained within the raw material tank 31 to an appropriate temperature.

A bubbling pipe 32 for supplying an Ar gas as a bubbling gas from the upper side is inserted into the raw material tank 31 so that the bubbling pipe 32 can be dipped in a ruthenium compound as a raw material. An Ar gas supply source 33 is coupled to the bubbling pipe 32. Furthermore, a mass flow controller 34 as a flow rate controller and valves 35 located before and after the mass flow controller 34 are mounted to the bubbling pipe 32. A source gas feeding pipe 36 is inserted into the raw material tank 31 from the upper side. The other end of the source gas feeding pipe 36 is coupled to the first introduction path 11 of the shower head 10. A valve 37 is mounted to the source gas feeding pipe 36. A heater 38 for preventing condensation of the ruthenium compound gas is installed in the source gas feeding pipe 36. An Ar gas as a bubbling gas is supplied to the ruthenium compound existing within the raw material tank 31. Thus, the ruthenium compound is vaporized by bubbling within the raw material tank 31. The ruthenium compound gas thus generated is supplied as a source gas into the shower head 10 through the source gas feeding pipe 36 and the first introduction path 11.

The bubbling pipe 32 and the source gas feeding pipe 36 are connected by a bypass pipe 48. A valve 49 is mounted to the bypass pipe 48. Valves 35a and 37a are mounted to the portions of the bubbling pipe 32 and the source gas feeding pipe 36 between the connection portions of the bypass pipe 48 and the raw material tank 31. By closing the valves 35a and 37a and opening the valve 49, the Ar gas of the Ar gas supply source 33 can be supplied as a purge gas into the chamber 1 through the bubbling pipe 32, the bypass pipe 48 and the source gas feeding pipe 36.

Instead of the Ar gas, other inert gases such as an $N_2$ gas and the like may be used as the bubbling gas or the purge gas.

A reducing gas supply pipe 40 is coupled to the second introduction path 12 of the shower head 10. A valve 41 is installed in the reducing gas supply pipe 40. The reducing gas supply pipe 40 is branched into branch pipes 40a and 40b. An $O_2$ gas supply source 42 for supplying an $O_2$ gas is coupled to the branch pipe 40a. An Ar gas supply source 43 for supplying an Ar gas as a dilution gas or a purge gas is coupled to the branch pipe 40b. A mass flow controller 44 as a flow rate controller and valves 45 existing before and after the mass flow controller 44 are mounted to the branch pipe 40a. A mass flow controller 46 as a flow rate controller and valves 47 existing before and after the mass flow controller 46 are mounted to the branch pipe 40b. Instead of the Ar gas, other inert gases such as an $N_2$ gas and the like may be used as the dilution gas or the purge gas.

The processing apparatus 100 includes a control unit 50 that controls the respective constituent parts, specifically the valves, the power supply, the heaters, the pumps and so forth. The control unit 50 includes a process controller 51 provided with a microprocessor (computer), a user interface 52 and a storage unit 53. The respective constituent parts of the processing apparatus 100 are electrically coupled to, and controlled by, the process controller 51. The user interface 52 is coupled to the process controller 51. The user interface 52 includes a keyboard by which an operator performs a command input operation or other operations to manage the respective constituent parts of the processing apparatus 100, a display which visually displays the operating situations of the respective constituent parts of the processing apparatus 100, and so forth. The storage unit 53 is coupled to the process controller 51. The storage unit 53 stores a control program for realizing various kinds of processes performed in the processing apparatus 100 through the control of the process controller 51, a control program, i.e., a process recipe, for enabling the respective constituent parts of the processing apparatus 100 to perform specified processes according to processing conditions, and various kinds of databases. The process recipe is stored in a storage medium 53a of the storage unit 53. According to one embodiment, the storage medium 53a may be a fixedly installed storage medium such as a hard disk or the like or may be a portable storage medium such as a CDROM, a DVD, a flash memory or the like. Moreover, a recipe may be appropriately transmitted from other devices through, e.g., a dedicated line.

If necessary, pursuant to an instruction transmitted from the user interface 52, a specified process recipe is called out from the storage unit 53 and is executed by the process controller 51. Thus, a desired process is performed in the processing apparatus 100 under the control of the process controller 51.

Next, description will be made on a ruthenium film formation method performed by the aforementioned processing apparatus 100. The gate valve 25 is opened. The wafer W is carried into the chamber 1 through the carry-in/carry-out gate 24 by virtue of a transfer device (not shown) and is mounted on the susceptor 2.

In this state, the formation of a ruthenium oxide ($RuO_2$) film of step S1 is performed for the first time. When forming the ruthenium oxide ($RuO_2$) film, the interior of the chamber 1 is evacuated by the exhaust device 23 to keep the interior of the chamber 1 at a predetermined pressure. The susceptor 2 is heated to a film formation temperature. An Ar gas as a carrier gas is supplied at a predetermined flow rate from the bubbling pipe 32 to the raw material tank 31 heated to, e.g., 80 to 200 degrees C., by the heater 31a. A ruthenium compound having the structure of the foregoing chemical formula (1) is vaporized by bubbling and is supplied as a source gas into the chamber 1 through the source gas feeding pipe 36, the first introduction path 11 and the shower head 10. An $O_2$ gas as a reducing gas is supplied from the $O_2$ gas supply source 42 into the chamber 1 through the branch pipe 40a, the reducing gas supply pipe 40, the second introduction path 12 and the shower head 10.

If the ruthenium compound gas having the structure of the foregoing chemical formula (1) and the $O_2$ gas as a reducing gas are supplied into the chamber 1 in this manner, the ruthenium compound gas and the $O_2$ gas react with each other on the surface of the wafer W heated by the susceptor 2. As a result, a ruthenium oxide ($RuO_2$) film is formed on the wafer W by thermal CVD. The ruthenium compound of the foregoing chemical formula (1) is liquid at a normal temperature and is relatively high in vapor pressure. Thus, the ruthenium compound can be easily supplied in a vapor phase.

According to one embodiment, the temperature for forming the ruthenium oxide film of step S1 ranges from 200 to 350 degrees C. The internal pressure of the chamber 1 ranges from 5 to 100 Torr (from 665 to 13330 Pa). The flow rate of the carrier gas ranges from 100 to 500 mL/min (sccm) [which is equivalent to the flow rate of the ruthenium compound of from 0.5 to 14.6 mL/min (sccm)]. The flow rate of the $O_2$ gas as a reducing gas ranges from 25 to 5000 mL/min (sccm).

In order to reliably form the ruthenium oxide ($RuO_2$) film using the ruthenium compound having the structure of the foregoing chemical formula (1), the partial pressure of the $O_2$ gas or the partial pressure ratio of the $O_2$ gas and the Ru compound gas may be adjusted within the chamber. According to one embodiment, the partial pressure of the $O_2$ gas within the chamber is 5 Torr (665 Pa) or more. According to one embodiment, the partial pressure ratio of the $O_2$ gas and the Ru compound gas is 20 or more.

When forming the ruthenium oxide ($RuO_2$) film, it is possible not only to simultaneously supply the ruthenium compound gas and the $O_2$ gas as described above but also to use an ALD method as shown in FIG. 4. An Ar gas supplied from the Ar gas supply source 43 can be used in the purge. An Ar gas can be supplied from the Ar gas supply source 33 through the bubbling pipe 32, the bypass pipe 48 and the source gas feeding pipe 36. It is also possible to use both of the Ar gas supply methods. Use of the ALD method makes it possible to obtain a ruthenium oxide ($RuO_2$) film containing a small amount of impurity at a low temperature.

By virtue of the aforementioned method, as described above, the ruthenium oxide ($RuO_2$) film can be formed with very high step coverage and at a high film formation rate.

After forming the ruthenium oxide ($RuO_2$) film, an Ar gas is supplied from the Ar gas supply sources 43 and 33 into the chamber 1 to purge the interior of the chamber 1. Then, the reduction process of the ruthenium oxide ($RuO_2$) film of step S2 is performed.

When reducing the ruthenium oxide film, the wafer W on which the ruthenium oxide film is formed is mounted on the susceptor 2. In this state, the susceptor 2 is heated to a processing temperature. The processing temperature of step S2 may range from 200 to 350 degrees C. According to one embodiment, in order to increase efficiency, the temperatures of steps S1 and S2 are set equal to each other.

If the ruthenium oxide ($RuO_2$) film is reduced by merely supplying a hydrogen-containing ruthenium compound as shown in FIG. 5A, an Ar gas such as a carrier gas is supplied at a predetermined flow rate from the bubbling pipe 32 to the raw material tank 31 heated to, e.g., 80 to 200 degrees C., by the heater 31a. The ruthenium compound having the structure of the foregoing chemical formula (1) is vaporized by bubbling and is supplied, as a hydrogen-containing ruthenium compound gas for the reduction of the ruthenium oxide ($RuO_2$) film, into the chamber 1 through the source gas feeding pipe 36, the first introduction path 11 and the shower head 10.

According to one embodiment, the internal pressure of the chamber 1 at this time ranges from 5 to 10 Torr (from 665 to 1333 Pa). The flow rate of the carrier gas ranges from 100 to 600 mL/min (sccm) [which is equivalent to the flow rate of the ruthenium compound of from 5 to 14.6 mL/min (sccm)]. The supply time of the ruthenium compound ranges from 60 to 300 sec.

If a hydrogen-containing ruthenium compound gas is first supplied and then an $O_2$ gas is supplied to decompose a hydrogen-containing ruthenium compound with the purge of the interior of the chamber performed therebetween as shown in FIG. 5B, the ruthenium compound gas is supplied under the aforementioned conditions. Thereafter, the interior of the chamber 1 is purged by an Ar gas. Subsequently, an $O_2$ gas is supplied from the $O_2$ gas supply source 42 into the chamber 1 through the branch pipe 40a, the reducing gas supply pipe 40, the second introduction path 12 and the shower head 10.

According to one embodiment, the internal pressure of the chamber 1 at this time ranges from 5 to 10 Torr (from 665 to 1333 Pa). The flow rate of the $O_2$ gas ranges from 500 to 2000 mL/min (sccm). The supply time of the $O_2$ gas ranges from 5 to 20 sec.

According to one embodiment, the supply of the hydrogen-containing ruthenium compound gas and the supply of the $O_2$ gas are alternately repeated a plurality of times (cycles) with the Ar gas purge performed therebetween as shown in FIG. 5C. The first ruthenium compound gas supply time ranges from 30 to 180 sec, the second and subsequent ruthenium compound gas supply time ranges from 20 to 40 sec, and the first oxygen gas supply time ranges from 5 to 20 sec. According to one embodiment, the number of repetition times (cycles) ranges from 2 to 500.

In the aforementioned manner, the processes from formation of the ruthenium oxide ($RuO_2$) film to the formation of the ruthenium (Ru) film by the reduction can be consistently carried out. Moreover, the ruthenium oxide ($RuO_2$) film can be formed with very good step coverage and at a high film formation rate. By reducing the ruthenium oxide ($RuO_2$) film, it is possible to form the ruthenium (Ru) film with high step coverage and high throughput.

Test Examples

Next, description will be made on test examples of the present disclosure.

In a first example, a $RuO_2$ film was formed on a wafer by a CVD method using a compound having the structure of the foregoing chemical formula (3) as a Ru compound and using an $O_2$ gas as a reducing gas. The $RuO_2$ film was reduced by supplying, as a hydrogen-containing Ru compound gas, the same ruthenium compound gas of the foregoing chemical formula (3) as used during the formation of the $RuO_2$ film, at a flow rate of 5 mL/min (sccm) with the supply time changed between 0 and 300 sec. The wafer temperature during the reduction was 255 degrees C.

The crystalline structures of the processed films were identified by X-ray diffraction (XRD). The X-ray diffraction spectra of the films when the supply time of the ruthenium compound gas is 0 sec, 60 sec, 120 sec and 300 sec are shown in FIGS. 8A to 8D. As shown in these figures, in the case of the film formed by not supplying the ruthenium compound gas (0 sec), the most intensive peak appeared at 28.067 degrees and $RuO_2$ was identified. In the case of the films formed by supplying the ruthenium compound gas for the supply time of 60 sec, 120 sec and 300 sec, the most intensive peak appeared at 44.039 degrees and Ru was identified. Thus, it was verified that the $RuO_2$ film is reduced into the Ru film by supplying the ruthenium compound gas for the supply time of 60 sec or more. It was also verified that the X-ray diffraction peaks do not overlap with each other in the $RuO_2$ film formed by not supplying the ruthenium compound gas (0 sec) and the Ru films formed by supplying the ruthenium compound gas for the supply time of 60 sec, 120 sec and 300 sec and further that the respective films totally differ in crystallinity.

Figure 9:
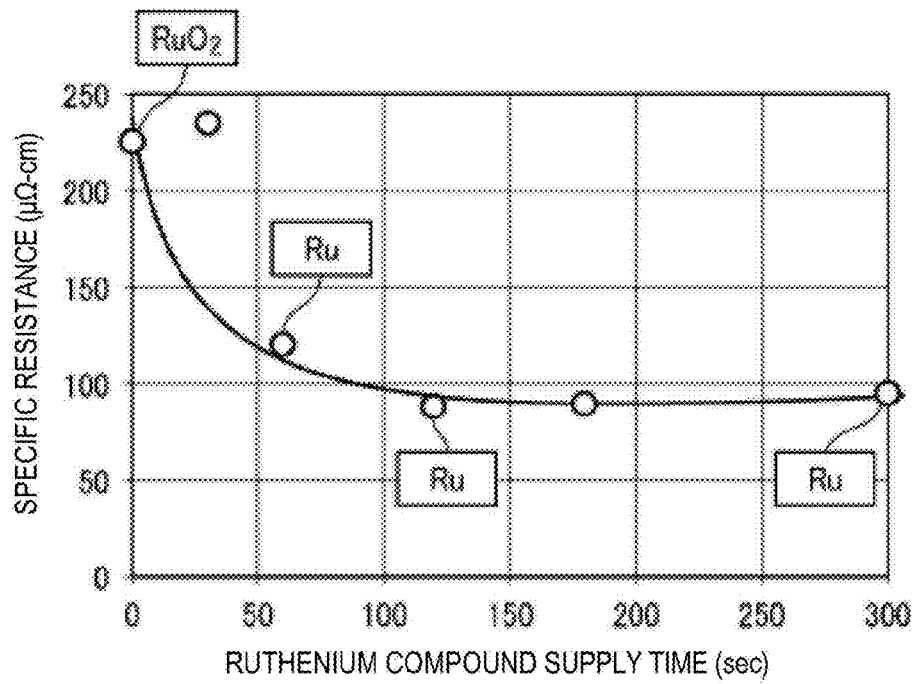
FIG. 9 is a graph showing the relationship between the supply time of a ruthenium compound gas and the specific resistance of a film.
Figure 10:
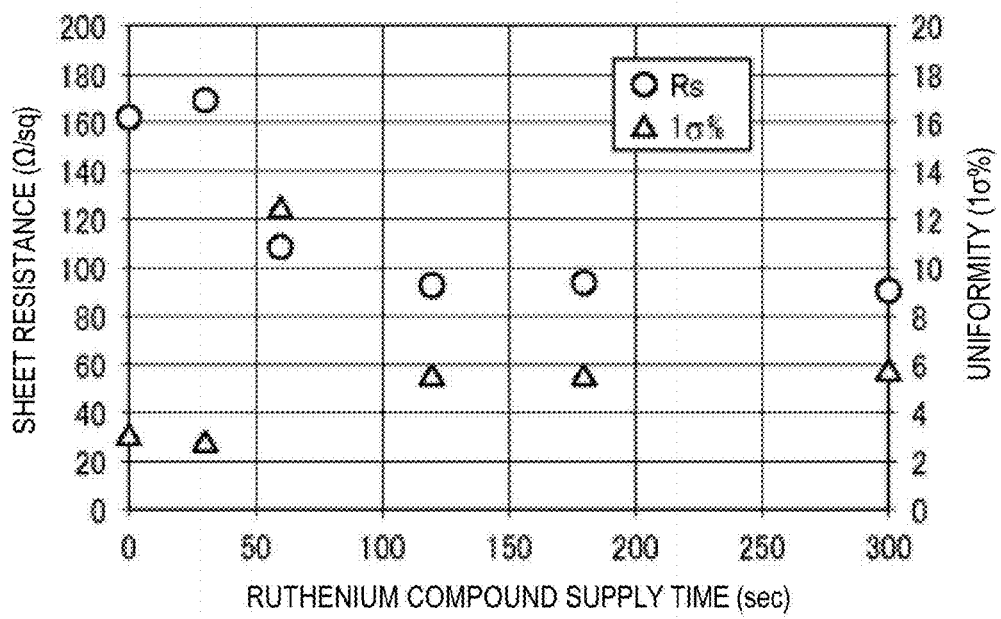
FIG. 10 is a graph showing the relationship between the supply time of a ruthenium compound gas, the sheet resistance of a film and the uniformity thereof.

Next, the specific resistance and the sheet resistance were measured with respect to the films formed by changing the supply time of the ruthenium compound gas. FIG. 9 is a graph showing the relationship between the supply time of the ruthenium compound gas and the specific resistance of the films. FIG. 10 is a graph showing the relationship between the supply time of the ruthenium compound gas, the sheet resistance of the film and the uniformity thereof. As shown in these figures, it was verified that the specific resistance and the sheet resistance are decreased along with the increase in the supply time of the ruthenium compound gas and further that, after the supply time of 120 sec, the decrease in the specific resistance and the sheet resistance are saturated and the specific resistance is decreased to at most about 100 $\mu\Omega \cdot cm$ which is a relatively high value in the Ru film. Presumably, this is because the continuity and the crystallinity still remain low.

Under these circumstances, study was conducted on a reduction process performed by alternately supplying a ruthenium compound gas and an $O_2$ gas as a reaction gas. In this test example, a $RuO_2$ film was formed on a wafer by a CVD method using a compound having the structure of the foregoing chemical formula (3) as a Ru compound and using an $O_2$ gas as a reducing gas, while changing the processing time to 140 sec, 280 sec and 560 sec. Thereafter, a reduction process was performed by alternately supplying, 10 cycles, a ruthenium compound gas of the foregoing chemical formula (3) and an $O_2$ gas as a reaction gas (alternate supply reduction). The reduction process was performed under the following processing conditions. The internal pressure of the chamber was 5 Torr (665 Pa). The first circulation time of the ruthenium compound gas was 50 sec. After purging the chamber, an oxygen ($O_2$) gas was circulated at a flow rate of 1000 sccm for 5 sec. After purging the chamber again, (1) the circulation of the ruthenium compound gas for 20 sec, (2) the purge of the chamber and (3) the circulation of the oxygen ($O_2$) gas at a flow rate of 1000 sccm for 5 sec were repeated nine times. At this time, the wafer temperature was 255 degrees C.

Figure 11B:
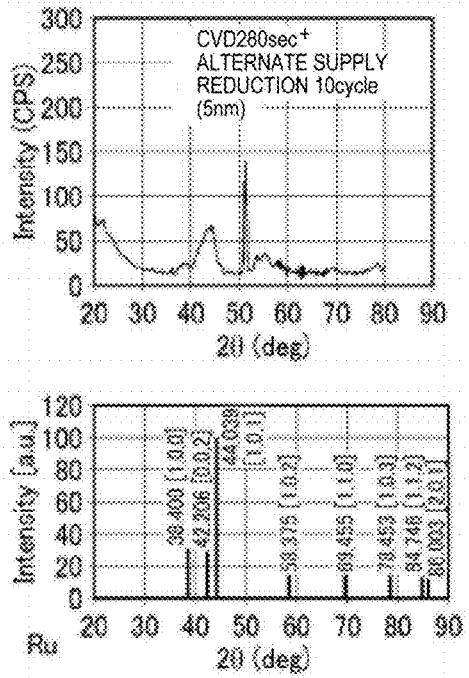
Figure 11C:
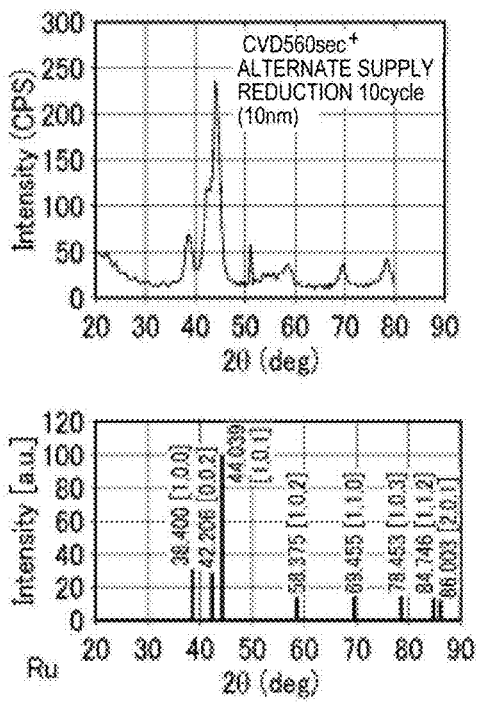

The crystalline structures of the processed films were identified by X-ray diffraction (XRD). The X-ray diffraction spectra of the films are shown in FIGS. 11A to 11C. As a result, it was verified that the most intensive peak appears at 44.039 degrees and Ru is identified. It was also verified that the $RuO_2$ film is reduced into a Ru film.

Figure 12:
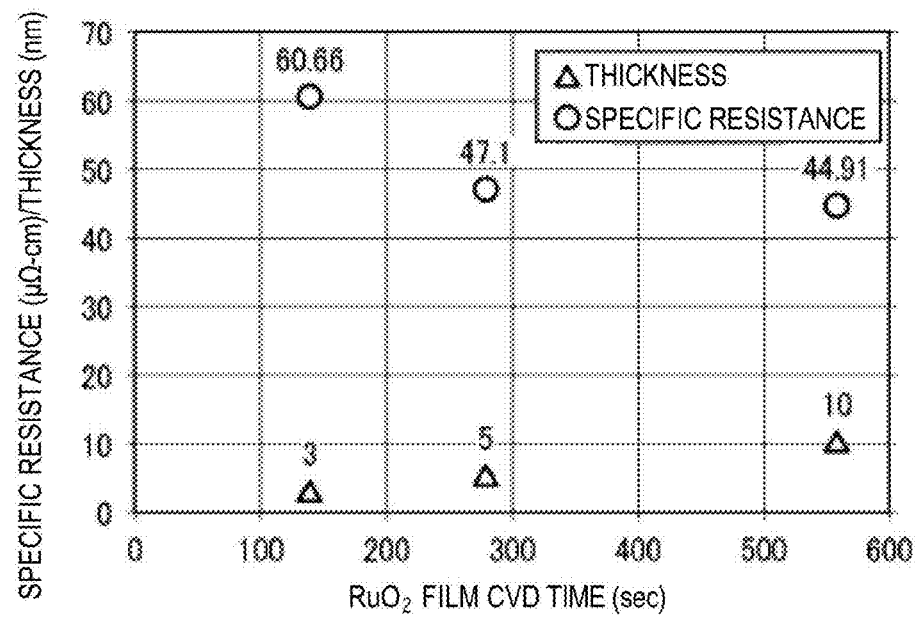
FIG. 12 is a graph showing the relationship between the $RuO_2$ film CVD time and the thickness and specific resistance of a Ru film obtained after performing 10 cycles of alternate supply reduction.
Figure 13:
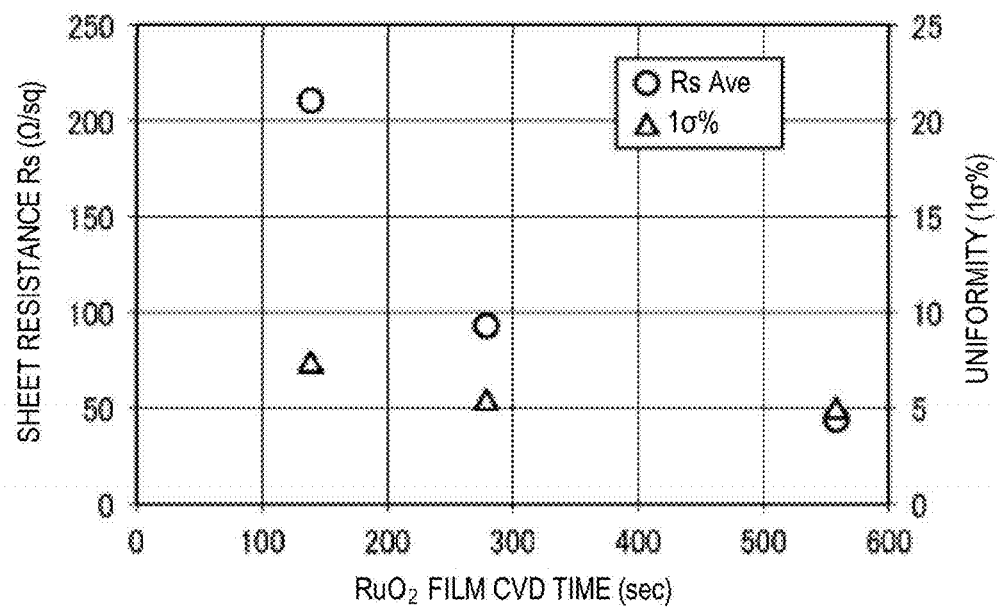
FIG. 13 is a graph showing the relationship between the $RuO_2$ film CVD time and the sheet resistance and uniformity of a Ru film obtained after performing 10 cycles of alternate supply reduction.

Next, the specific resistance and the sheet resistance were measured with respect to the Ru films formed by reducing the CVD-processed $RuO_2$ film while changing the processing time in the aforementioned manner. FIG. 12 is a graph showing the relationship between the $RuO_2$ film CVD time and the thickness and specific resistance of the reduced Ru film. FIG. 13 is a graph showing the relationship between the $RuO_2$ film CVD time and the sheet resistance and uniformity of the reduced Ru film. As shown in FIG. 12, it was verified that the specific resistance of the reduced Ru film is lower than the specific resistance available when the reduction is performed by merely supplying the ruthenium compound and further that the crystallinity of the reduced Ru film is improved by the reduction performed by alternately supplying the ruthenium compound gas and the $O_2$ gas. The film thickness was increased along with the increase in the $RuO_2$ film CVD time. Moreover, the specific resistance shows film thickness dependency in that the specific resistance is decreased along with the increase in the film thickness. When the film thickness is 5 nm or more, the specific resistance was saturated at or around 44 $\mu\Omega \cdot cm$. Even when the film thickness is 3 nm, the specific resistance was as low as 60.66 $\mu\Omega \cdot cm$. As shown in FIG. 13, the sheet resistance is decreased along with the increase in the film thickness. The uniformity of sheet resistance $1\sigma$ of the film is about 7% when the film thickness is 3 nm and about 5% when the film thickness is 5 nm or more. Thus, it was possible to obtain good uniformity. It is presumed that this uniformity succeeds to the intrinsic uniformity of sheet resistance of the $RuO_2$ film.

Figure 14:
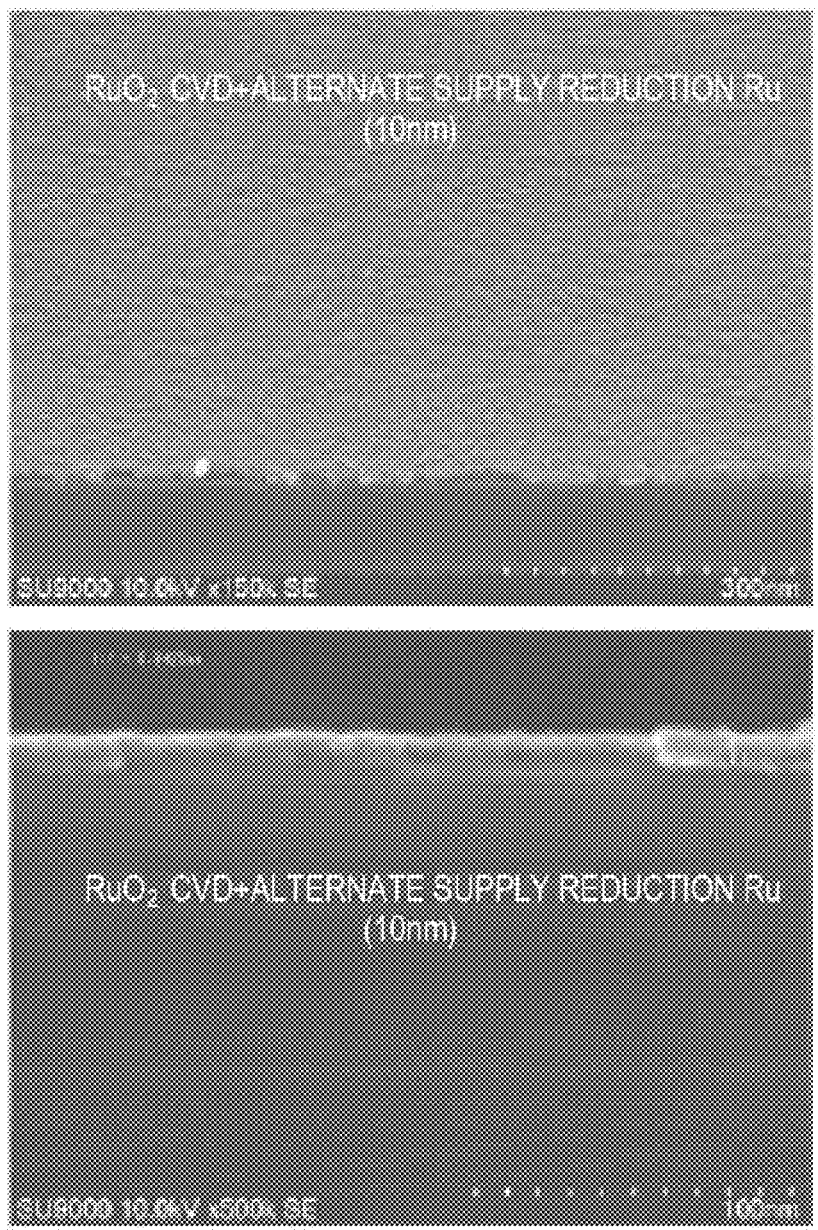
FIG. 14 shows SEM photographs of a surface and a cross section of a film obtained after performing 10 cycles of alternate supply reduction with respect to a $RuO_2$ film formed in a CVD method.

FIG. 14 is scanning electron microscope (SEM) photographs of the surface and the cross section of the Ru film of 10 nm in thickness obtained by the reduction process. As shown in this figure, it was verified that the reduced film is continuous and the surface of the film is flat. In view of the content shown in FIG. 14 and the X-ray diffraction spectra of X-ray diffraction (XRD) shown in FIG. 11, it was verified that a robust Ru film is obtained.

Next, a $RuO_2$ film was formed on a wafer by a CVD method using a compound having the structure of the foregoing chemical formula (3) as a Ru compound and using an $O_2$ gas as a reducing gas, while fixing the processing time to 560 sec. Thereafter, a reduction process was performed by alternately supplying a ruthenium compound gas of the foregoing chemical formula (3) and an $O_2$ gas as a reaction gas with the purge performed therebetween, while changing the number of cycles to 3, 5, 10 and 20. The reduction process was performed under the following processing conditions. The internal pressure of the chamber was 5 Torr (665 Pa). The first circulation time of the ruthenium compound gas was 50 sec. After purging the chamber, an oxygen ($O_2$) gas was circulated at a flow rate of 1000 sccm for 5 sec. After purging the chamber again, (1) the circulation of the ruthenium compound gas for 20 sec, (2) the purge of the chamber and (3) the circulation of the oxygen ($O_2$) gas at a flow rate of 1000 sccm for 5 sec were repeated. At this time, the wafer temperature was 255 degrees C.

Figure 15:
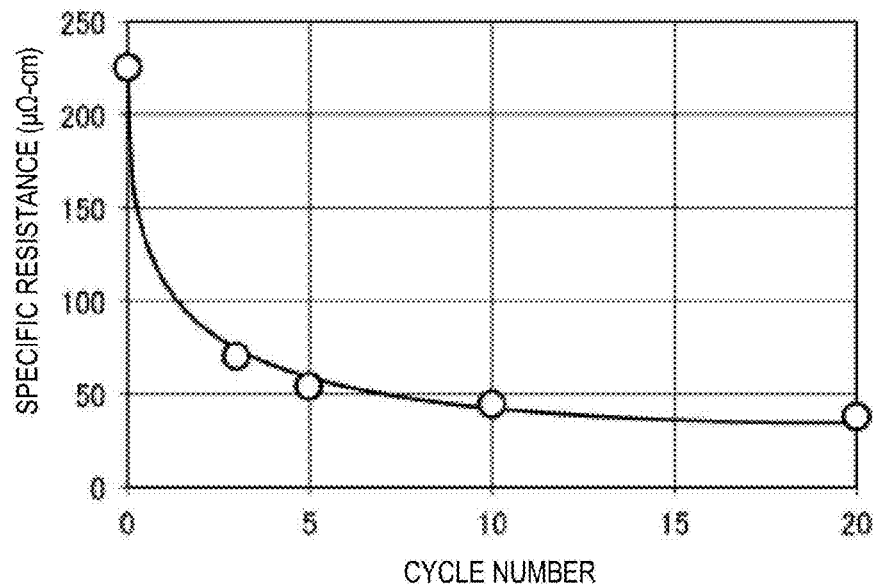
FIG. 15 is a graph showing the relationship between the cycle number when performing alternate supply reduction with respect to a $RuO_2$ film formed in a CVD method while changing the cycle number and the specific resistance of a Ru film obtained by reducing the $RuO_2$ film.
Figure 16:
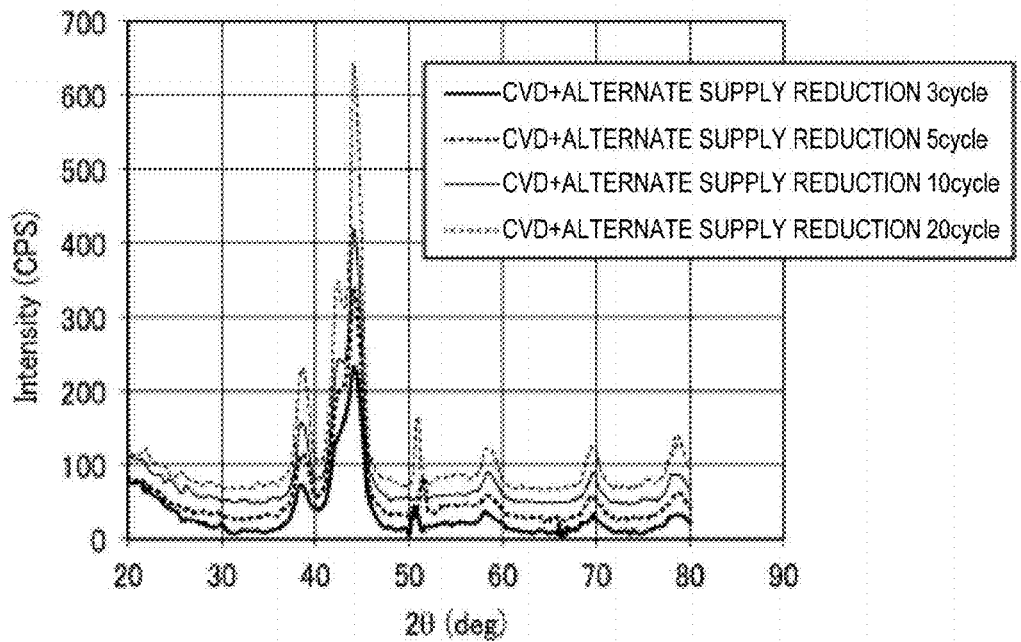
FIG. 16 is an X-ray diffraction spectra for identifying the crystallinity when performing alternate supply reduction with respect to a $RuO_2$ film formed in a CVD method while changing the cycle number.

FIG. 15 shows the relationship between the cycle number when performing the reduction process and the specific resistance of the Ru film obtained by the reduction. FIG. 16 shows the crystallinity of the Ru films obtained by changing the cycle number of the alternate supply reduction, which was verified by X-ray diffraction (XRD) results. As shown in FIG. 15, it can be noted that the $RuO_2$ film subjected to 3 cycles of reduction processes shows a sharp decrease in specific resistance as compared with the $RuO_2$ film not subjected to any reduction process and further that the $RuO_2$ film is reduced into a Ru film at the time when the alternate supply reduction is performed for 3 cycles. In addition, it was verified from the X-ray diffraction spectra shown in FIG. 16 that the peak of Ru appearing at 44.039 degrees grows higher along with the increase in the cycle number of the alternate supply reduction and further that the crystallinity of the Ru film obtained by the reduction is improved by the increase in the cycle number.

Figure 17:
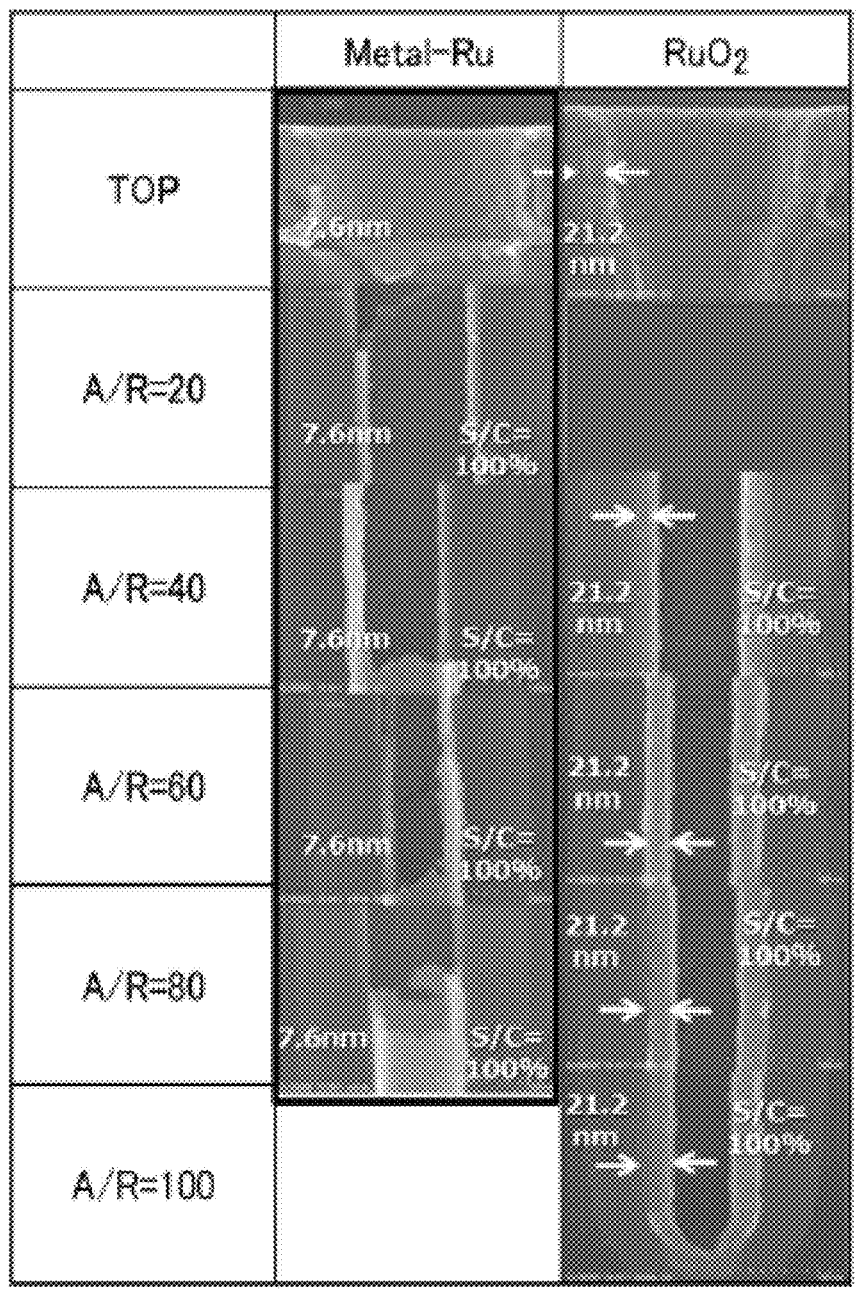
FIG. 17 is SEM photographs of films after forming a $RuO_2$ film on a wafer having a hole in a CVD method and then performing 10 cycles of alternate supply reduction.

Next, a RuO$_2$ film was formed on a wafer having a hole of 80 nm in diameter and 8000 nm in depth by a CVD method using a compound having the structure of the foregoing chemical formula (3) as a Ru compound and using an O$_2$ gas as a reducing gas, while fixing the processing time to 560 sec. Consequently, as can be seen in the SEM photographs shown in FIG. 17, a film was formed with the step coverage (S/C) of 100% up to the position where an aspect ratio (A/R) is equivalent to 80. Subsequently, a reduction process was performed by alternately supplying, 10 cycles, a ruthenium compound gas of the foregoing chemical formula (3) and an O$_2$ gas as a reaction gas with the purge performed therebetween. The reduction process was performed under the following processing conditions. The internal pressure of the chamber was 5 Torr (665 Pa). The first circulation time of the ruthenium compound gas was 50 sec. After purging the chamber, an oxygen (O$_2$) gas was circulated at a flow rate of 1000 sccm for 5 sec. After purging the chamber again, (1) the circulation of the ruthenium compound gas for 20 sec, (2) the purge of the chamber and (3) the circulation of the oxygen (O$_2$) gas at a flow rate of 1000 sccm for 5 sec were repeated nine times. At this time, the wafer temperature was 255 degrees C. As a result, as shown in FIG. 17, the reduced film shows characteristics specific to the Ru film which is extremely worse in adhesion than the RuO$_2$ film. From the viewpoint of morphology, it is considered that the Ru film is obtained. It is also considered that the step coverage (S/C) is 100% even after the reduction process and further that the Ru film can be formed by the reduction while maintaining the step coverage of the RuO$_2$ film during the CVD.

Other Applications

The present disclosure is not limited to the aforementioned embodiment but may be modified in many different forms. For example, the aforementioned embodiments are illustrated with examples in which the ruthenium oxide (RuO$_2$) film is formed by a CVD method (including an ALD method) primarily using the ruthenium compound gas of the foregoing chemical formula (1) and the O$_2$ gas. However, the type of the ruthenium compound gas used during the CVD is not limited to the aforementioned one. The method of forming the ruthenium oxide (RuO$_2$) film is not limited to the CVD method. The hydrogen-containing ruthenium compound used in the reduction process is not limited to the ruthenium compound gas of the foregoing chemical formula (1). It is only necessary that the ruthenium compound contains hydrogen. In addition, the ruthenium compound is not limited to the raw material used in the CVD.

The aforementioned embodiments are illustrated with examples in which the ruthenium (Ru) film is applied to an upper or lower electrode of a SrTiO film as a capacitor film. Alternatively, the ruthenium (Ru) film may be applied to an upper or lower electrode of a capacitor film other than the SrTiO film, such as a laminate film of ZnO, Al$_2$O$_3$, ZrO or ZnO and Al$_2$O$_3$. Moreover, the ruthenium (Ru) film may be applied to other uses such as a gate electrode as a conductive member, a contact barrier film and the like.

The structure of the processing apparatus is not limited to the one of the aforementioned embodiment. The method of supplying the ruthenium compound is not limited to the bubbling of the aforementioned embodiment. The ruthenium compound may be supplied through the use of a vaporizer or may be supplied in a vapor form by heating the same. The processing apparatus may be divided into an apparatus for forming the ruthenium oxide (RuO$_2$) film and an apparatus for the reduction process.

According to the present disclosure, after forming a ruthenium oxide film that can be formed with high step coverage and high throughput, the ruthenium oxide film is reduced by a ruthenium compound containing hydrogen. Thus, the contraction of a film during the reduction is relieved. It is therefore possible to form a good ruthenium film with high step coverage without reducing throughput.

While certain embodiments have been described, these embodiments have been presented by way of example only, and are not intended to limit the scope of the disclosures. Indeed, the novel method and storage medium described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A ruthenium film formation method, comprising:
   forming a ruthenium oxide film on a substrate; and
   reducing the ruthenium oxide film into a ruthenium film,
   wherein the reducing the ruthenium oxide film comprises at least supplying a ruthenium compound gas containing hydrogen as a reducing agent and then supplying a reaction gas for decomposing the ruthenium compound gas containing hydrogen.

2. The method of claim 1, wherein the forming the ruthenium oxide film comprises forming the ruthenium oxide film by a CVD method using a ruthenium compound.

3. The method of claim 2, wherein the forming the ruthenium oxide film comprises forming the ruthenium oxide film on the substrate by supplying the ruthenium compound having a structure of the following chemical formula (1) in which two β-diketones and two groups selected from olefin, amine, nitrile and carbonyl are coordinated in Ru, to the substrate in a vapor phase state, supplying an oxygen gas to the substrate and allowing the ruthenium compound and the oxygen gas to react with each other:

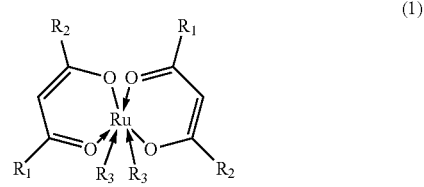

(1)

where R$_1$ and R$_2$ are alkyl groups whose total carbon number is 2 to 5 and R$_3$ is a group selected from an olefin group, an amine group, a nitrile group and a carbonyl group.

4. The method of claim 3, wherein the forming the ruthenium oxide film is performed by simultaneously supplying the ruthenium compound of the vapor phase state and the oxygen gas.

5. The method of claim 3, wherein the forming the ruthenium oxide film is performed by alternately supplying the ruthenium compound of the vapor phase state and the oxygen gas with purge performed therebetween.

6. The method of claim 2, wherein the ruthenium compound gas containing hydrogen contains a ruthenium compound which is the same as the ruthenium compound used in forming the ruthenium oxide film.

7. The method of claim 1, wherein a ruthenium compound contained in the ruthenium compound gas containing hydrogen has a structure of the following chemical formula (1) in which two β-diketones and two groups selected from olefin, amine, nitrile and carbonyl are coordinated in Ru:

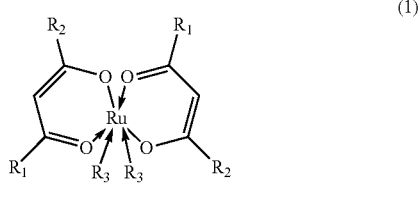

(1)

where $R_1$ and $R_2$ are alkyl groups whose total carbon number is 2 to 5 and $R_3$ is a group selected from an olefin group, an amine group, a nitrile group and a carbonyl group.

8. The method of claim 1, wherein the reducing the ruthenium oxide film is performed by alternately supplying, a plurality of times, the ruthenium compound gas containing hydrogen as the reducing agent and the reaction gas for decomposing the ruthenium compound gas containing hydrogen with purge performed therebetween.

9. A non-transitory storage medium operated on a computer and configured to store a program for controlling a processing apparatus, wherein the program, when executed, causes the computer to control the processing apparatus so as to perform the ruthenium film formation method of claim 1.

10. A ruthenium film formation method, comprising:
forming a ruthenium oxide film on a substrate
by supplying a ruthenium compound having a structure of the following chemical formula (1) in which two β-diketones and two groups selected from olefin, amine, nitrile and carbonyl are coordinated in Ru, to the substrate in a vapor phase state, supplying an oxygen gas to the substrate and allowing the ruthenium compound and the oxygen gas to react with each other:

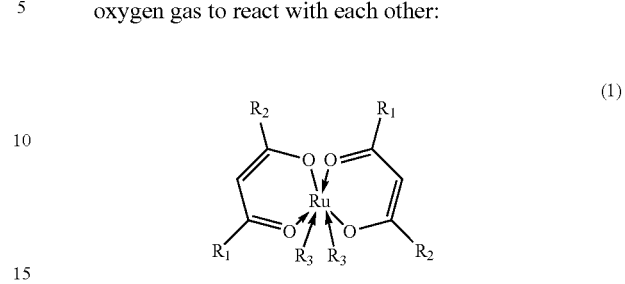

(1)

where $R_1$ and $R_2$ are alkyl groups whose total carbon number is 2 to 5 and $R_3$ is a group selected from an olefin group, an amine group, a nitrile group and a carbonyl group; and reducing the ruthenium oxide film into a ruthenium film by supplying a ruthenium compound gas containing a ruthenium compound having the structure of the foregoing chemical formula (1) as a reducing agent and then supplying an oxygen gas.

11. The method of claim 10, wherein the reducing the ruthenium oxide film is performed by alternately supplying, a plurality of times, the ruthenium compound gas and the oxygen gas with purge performed therebetween.

12. The method of claim 11, wherein the number of repeated supply cycles of the ruthenium compound gas and the oxygen gas in the reducing the ruthenium oxide film is 2 to 500.

* * * * *